(12) United States Patent
Tseng et al.

(10) Patent No.: US 9,933,149 B2
(45) Date of Patent: Apr. 3, 2018

(54) ILLUMINATION APPARATUS

(71) Applicant: Subtron Technology Co., Ltd., Hsinchu County (TW)

(72) Inventors: Tzyy-Jang Tseng, Hsinchu (TW); Tzu-Shih Shen, Hsinchu (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 191 days.

(21) Appl. No.: 14/691,594

(22) Filed: Apr. 21, 2015

(65) Prior Publication Data
US 2016/0209023 A1 Jul. 21, 2016

(30) Foreign Application Priority Data
Jan. 15, 2015 (TW) .............................. 104101331 A

(51) Int. Cl.
*F21V 31/00* (2006.01)
*F21V 29/85* (2015.01)
(Continued)

(52) U.S. Cl.
CPC ........ *F21V 31/005* (2013.01); *F21V 19/0035* (2013.01); *F21V 27/02* (2013.01);
(Continued)

(58) Field of Classification Search
CPC ...... F21V 31/005; F21V 19/002; H05B 33/04
See application file for complete search history.

(56) References Cited

U.S. PATENT DOCUMENTS 7,182,627 B1 * 2/2007 Huang ...................... F21K 9/00
362/800
2005/0077616 A1 * 4/2005 Ng ............................ H01L 23/36
257/707
(Continued)

FOREIGN PATENT DOCUMENTS

| CN | 102620150 | 8/2012 |
| TW | 200928222 | 7/2009 |

OTHER PUBLICATIONS

"Office Action of Taiwan Counterpart Application", dated Jul. 21, 2016, p. 1-p. 5, in which the listed references were cited.

*Primary Examiner* — Anh Mai
*Assistant Examiner* — Zachary J Snyder
(74) *Attorney, Agent, or Firm* — JCIPRNET

(57) ABSTRACT

An illumination apparatus includes a thermal conductivity substrate, a package carrier, at least one light emitting element, at least one wire, a light transmission cap, a first sealing ring and a second sealing ring. The package carrier is disposed on an upper surface of the thermal conductivity substrate and has an opening exposing a portion of the upper surface. The light emitting element is disposed on the upper surface exposed by the opening and is electrically connected to the package carrier by wire. The light transmission cap is disposed above the thermal conductivity substrate. The first sealing ring is disposed between the light transmission cap and the package carrier. The second sealing ring is disposed between the package carrier and the thermal conductivity substrate. The thermal conductivity substrate, the light transmission cap, the first and the second sealing rings and the package carrier encapsulate the light emitting element.

11 Claims, 3 Drawing Sheets

(51) Int. Cl.
    *F21V 27/02*    (2006.01)
    *F21V 19/00*    (2006.01)
    *F21V 29/70*    (2015.01)
    *F21V 29/76*    (2015.01)
    *F21Y 115/10*   (2016.01)

(52) U.S. Cl.
    CPC ............ *F21V 29/70* (2015.01); *F21V 29/763* (2015.01); *F21V 29/85* (2015.01); *F21Y 2115/10* (2016.08)

(56) References Cited

U.S. PATENT DOCUMENTS

2010/0002435 A1    1/2010    Rash
2014/0090794 A1*   4/2014    Tseng ................ H01L 23/49827
                                                          164/69.1
2014/0268822 A1*   9/2014    Olsson .................... F21V 31/03
                                                          362/362

* cited by examiner

ILLUMINATION APPARATUS

CROSS-REFERENCE TO RELATED APPLICATION

This application claims the priority benefit of Taiwan application serial no. 104101331, filed on Jan. 15, 2015. The entirety of the above-mentioned patent application is hereby incorporated by reference herein and made a part of this specification.

BACKGROUND OF THE INVENTION

Field of the Invention

The invention relates to an illumination apparatus, and more particularly, to a waterproof illumination apparatus.

Description of Related Art

FIG. 1 is a schematic view of a conventional illumination apparatus. Referring to FIG. 1, inside a conventional illumination apparatus 10, the light emitting diode 20 is disposed on the package carrier 30 by wire bonding method and energized to emit light by electrically connecting to an external circuit (not shown) through the wire 40 that is also disposed on the package carrier 30. Herein, the package carrier 30 is disposed on the heat spreader 50, and the heat spreader 50 is disposed on heat dissipation fins 60 to enhance the heat dissipation effect. The light transmission cap portion 72 of the light transmission cap 70 is located above the light emitting diode 20, and the light transmission cap 70 is positioned and fixed by the first metal cover 80 and the second metal cover 90. To be more specific, the flat portion 74 of the light transmission cap 70 is disposed above the second metal cover 90 and located between the first metal cover 80 and the second metal cover 90, in which the waterproofing sealing between the light transmission cap 70 and the second metal cover 90 is achieved by the first O-ring O1. The second metal cover 90 having an opening 92 is disposed on the heat dissipation fins 60, in which the opening 92 exposes the light emitting diode 20, and the waterproofing sealing between the second metal cover 90 and the heat dissipation fins 60 is achieved by the second O-ring O2. As illustrated in FIG. 1, the first metal cover 80 and the second metal cover 90 are fixed to each other by using screws, and the second metal cover 90 and the heat dissipation fins 60 are fixed to each other by using screws.

Therefore, the conventional illumination apparatus 10 uses two metal covers (i.e. the first metal cover 80 and the second metal cover 90) such that the volume, the thickness, the weight, and the manufacturing cost of the illumination apparatus 10 can not be efficiently reduced. In addition, although the first O-ring O1 and the second O-ring O2 seal and waterproof for the light emitting diode 20, the electric wire 40 passes through the second metal cover 90 and electrically connects to an external circuit (not shown) such that waterproofing plug W needs to be applied at the interface between the second metal cover 90 and the electric wire 40 to achieve the complete sealing effect successfully for the light emitting diode 20. In other words, the waterproofing plug W must be used to obtain the complete sealing effect for the light emitting diode 20 and the manufacturing cost of the conventional illumination apparatus is thus higher.

SUMMARY OF THE INVENTION

The invention is directed to an illumination apparatus having efficiently lower manufacturing cost, smaller volume, thinner thickness and lighter weight.

The invention provides an illumination apparatus including a thermal conductivity substrate, a package carrier, at least one light emitting element, at least one bonding wire, a light transmission cap, a first seal ring and a second seal ring. The thermal conductivity substrate has an upper surface. The package carrier, having an opening, is disposed on the upper surface of the thermal conductivity substrate. The opening exposes a part of the upper surface. The light emitting element is disposed on the upper surface of the thermal conductivity substrate exposed by the opening of the package carrier. The light emitting element is electrically connected to the package carrier by the bonding wire. The light transmission cap is disposed above the thermal conductivity substrate. The light emitting element and the package carrier are located between the light transmission cap and the thermal conductivity substrate. The first seal ring is located between the light transmission cap and the package carrier. The second seal ring is disposed between the package carrier and the thermal conductivity substrate. The thermal conductivity substrate, the light transmission cap, the first seal ring, the second seal ring, and the package carrier encapsulate the light emitting element.

In one embodiment of the invention, the thermal conductivity substrate includes a heat spreader or a heat dissipation plate.

In one embodiment of the invention, the first seal ring and the second seal ring are respectively O-shaped rings.

In one embodiment of the invention, the light transmission cap includes a light transmission cap portion and a flat portion, and the light transmission cap portion is disposed correspondingly to the light emitting element.

In one embodiment of the invention, the illumination apparatus further includes a cover, a heat dissipation fin set and an electric wire. The cover includes a top portion, a plurality of side portions connecting to the top portion, and the top portion is disposed on the flat portion of the light transmission cap. The heat dissipation fin set is disposed on the lower surface of the thermal conductivity substrate and fixed to the side portions of the cover, and the lower surface is opposite to the upper surface of the thermal conductivity substrate. The electric wire is electrically connected to the package carrier and located among the first seal ring, the second seal ring and the cover.

In one embodiment of the invention, a material of the cover includes a metal or a plastic.

In one embodiment of the invention, the illumination apparatus further includes a wire fixing structure. The electric wire is electrically connected to the package carrier. The wire fixing structure is penetrating through the package carrier and located among the first seal ring, the second seal ring and the cover, and the electric wire is stored by the wire fixing structure.

In one embodiment of the invention, the wire fixing structure includes a wire fixing terminal portion and wire storage portion. One terminal of the electric wire is plugged in the wire fixing terminal portion and another terminal passes through the wire storage portion and the cover.

In one embodiment of the invention, the package carrier includes at least one insulating layer, a plurality of conductive layers, and a solder mask layer. The insulating layer and the conductive layers are alternatively stacked up, the solder mask layer exposes a part of one conductive layer to define at least one bonding pad, and a terminal of the bonding wire is disposed on the bonding pad.

In one embodiment of the invention, the conductive layer closest to the thermal conductivity substrate has a rough surface structure and the rough surface structure contacts with the thermal conductivity substrate.

In view of the above, the light emitting element of the invention is disposed on the thermal conductivity substrate exposed by the opening of the package carrier and electrically connected to the package carrier by the bonding wire. The thermal conductivity substrate, the light transmission cap, the first seal ring, the second sealing ring, and the package carrier encapsulate the light emitting element. Therefore, the complete sealing effect is achieved by organizing the thermal conductivity substrate, the light transmission cap, the first seal ring, the second sealing ring, and the package carrier instead of using a plurality of metal covers and a waterproofing plug. As a result, the illumination apparatus of the invention has smaller volume, thinner thickness, lighter weight, and lower manufacturing cost than the conventional illumination apparatus.

Several exemplary embodiments accompanied with figures are described in detail below to further describe the invention in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the invention.

DESCRIPTION OF EMBODIMENTS

Figure 1:
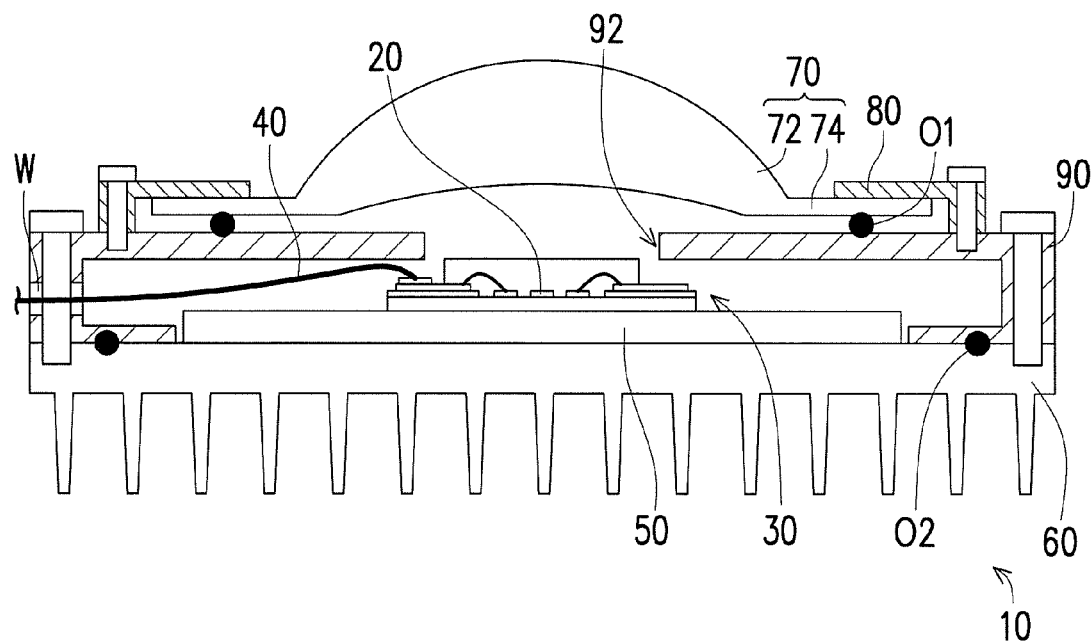
FIG. 1 is a schematic view of a conventional illumination apparatus.
Figure 2A:
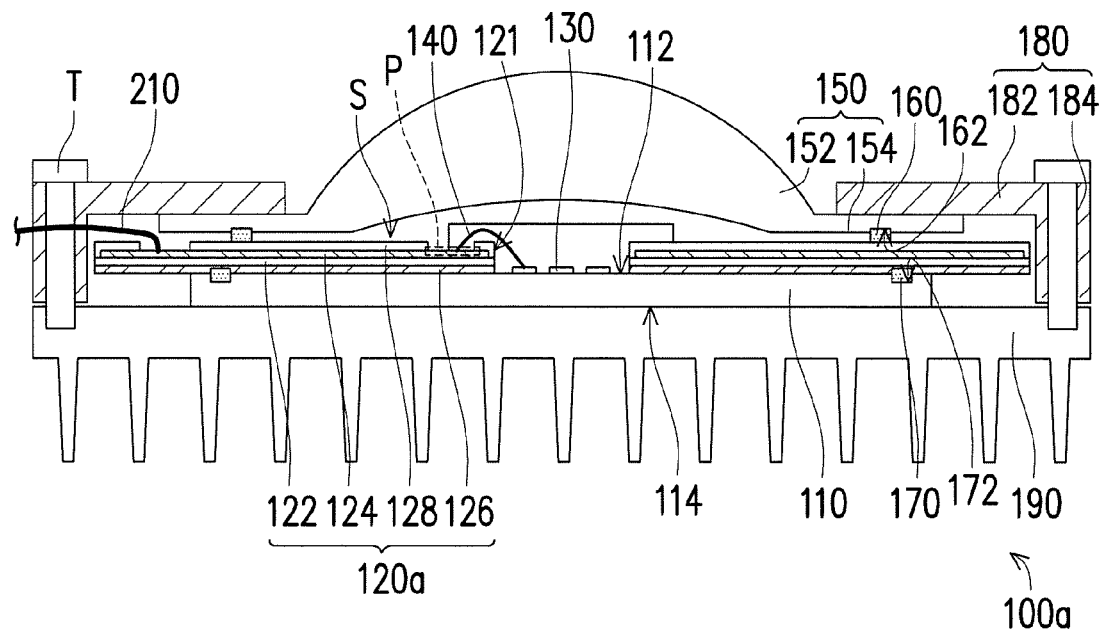
FIG. 2A is a schematic view of an illumination apparatus according to one embodiment of the invention.
Figure 2B:
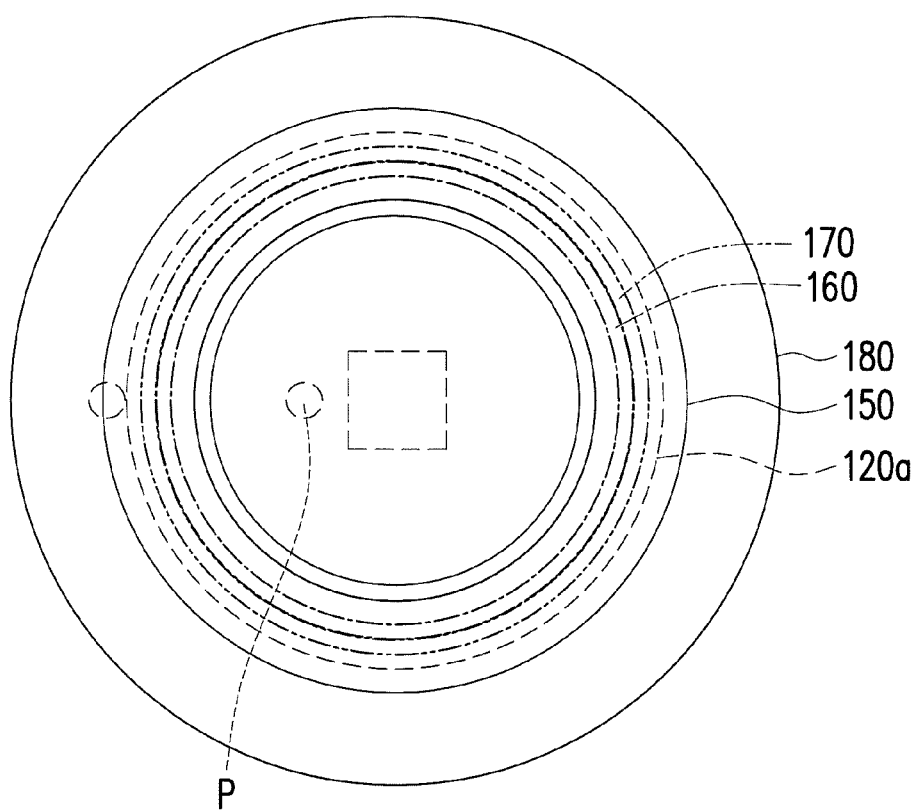
FIG. 2B is a schematic top view of a light transmission cap, the cover, the package carrier, the first seal ring, and the second seal ring of FIG. 2A.

FIG. 2A is a schematic view of an illumination apparatus according to one embodiment of the invention. FIG. 2B is a schematic top view of a light transmission cap, a cover, a package carrier, a first seal ring, and a second seal ring of FIG. 2A. Referring to FIG. 2A and FIG. 2B, in the present embodiment, an illumination apparatus 100a includes a thermal conductivity substrate 110, a package carrier 120a, at least one light emitting element 130 (only three elements are shown in FIG. 2A), at least one bonding wire 140 (only one bonding wire is shown in FIG. 2A), a light transmission cap 150, a first seal ring 160 and a second seal ring 170.

More specifically, the thermal conductivity substrate 110 has an upper surface 112. The package carrier 120a, having an opening 121, is disposed on the upper surface 112 of the thermal conductivity substrate 110, and the opening 121 exposes a part of the upper surface 112. The light emitting element 130 is disposed on the upper surface 112 of the thermal conductivity substrate 110, in which the upper surface 112 is exposed by the opening 121 of the package carrier 120a. The light emitting element 130 is electrically connected to the package carrier 120a through the bonding wire 140. The light transmission cap 150 is disposed above the thermal conductivity substrate 110. The light emitting element 130 and the package carrier 120a are located between the light transmission cap 150 and the thermal conductivity substrate 110. The first seal ring 160 is disposed between the light transmission cap 150 and the package carrier 120a. The second seal ring 170 is disposed between the package carrier 120a and the thermal conductivity substrate 110. The thermal conductivity substrate 110, the light transmission cap 150, the first seal ring 160, the second seal ring 170 and the package carrier 120a encapsulate the light emitting element 130.

Specifically, the thermal conductivity substrate 110 of the present embodiment is, for example, a heat spreader or a heat dissipation plate, and the light emitting element 130 is, for example, a light emitting diode, but not limited thereto. Because the light emitting element 130 of the present embodiment is directly disposed on the upper surface 112 of the thermal conductivity substrate 110 exposed by the opening 121 of the package carrier 120a, a better heat dissipation effect can be obtained in the illumination apparatus 100a of the present embodiment comparing to the conventional illumination apparatus 10 which the light emitting diode 20 is disposed on the package carrier 30.

Furthermore, the package carrier 120a of the present embodiment is constructed by at least one insulating layer 122 (only one layer is shown in FIG. 2A), a plurality of conductive layers 124, 126 and a solder mask layer 128. The insulating layer 122 and the conductive layers 124, 126 are alternatively stacked up, and the solder mask layer 128 exposes a part of one conductive layer 124 to define at least one bonding pad P. One terminal of the bonding wire 140 is connected to the bonding pad P, and another terminal of the bonding wire 140 is attached on the light emitting element 130. In another words, the light emitting element 130 of the present embodiment is electrically connected to the package carrier 102a by a wire bonding method.

In addition, the light transmission cap 150 of the present embodiment is constructed by a light transmission cap portion 152 and a flat portion 154 connecting to the light transmission cap portion 152. Herein, the light transmission cap portion 152 is disposed correspondingly to the light emitting element 130, and the flat portion 154 is fixed on the package carrier 120a through the first seal ring 160. More specifically, the first seal ring 160 is disposed between the light transmission cap 150 and the package carrier 120a to attain the sealing effect, and the second seal ring 170 is disposed between the package carrier 120a and the thermal conductivity substrate 110 to achieve the sealing effect as well. Therefore, the thermal conductivity substrate 110, the light emitting cap 150, the first seal ring 160, the second sealing ring 170, and the package carrier 120a are compelled tightly against one another to construct a waterproofing chamber S to encapsulate the light emitting element 130. In another words, the package carrier 120a is also an element to construct the waterproofing chamber S and has electrically connecting function, originally. The light transmission cap 150 can be a lens or a plastic cap, or constructed by light transmitting materials such as glass or plastic, but not limited thereto.

Herein, the first seal ring 160 and the second seal ring 170 are made by the waterproof and resilient rubber material. As shown in FIG. 2B, the first seal ring 160 and the second seal ring 170 of the present embodiment are respectively O-shaped rings, but not limited thereto. In addition, the first positioning trench 162 and the second positioning trench 172, respectively, can be optionally disposed on the light transmission cap 150 and the thermal conductivity substrate 110 to assist positioning the first seal ring 160 and the second seal ring 170.

In the embodiment, because the light emitting element 130 of the illumination apparatus 100a is disposed on the thermal conductivity substrate 110 exposed by the opening 121 of the package carrier 120a and electrically connected to the package carrier 120a by the bonding wire 140. Herein, the thermal conductivity substrate 110, the light transmission cap 150, the first seal ring 160, the second seal ring 170, and the package carrier 120a encapsulate the light emitting element 130. Therefore, in the illumination apparatus 100a of the present embodiment, the complete sealing effect surrounding the light emitting element 130 is achieved by organizing the thermal conductivity substrate 110, the light transmission cap 150, the first seal ring 160, the second sealing ring 170, and the package carrier 120a instead of using a plurality of metal covers and waterproofing plug. As a result, the illumination apparatus 100a of the embodiment has smaller volume, thinner thickness, lighter weight, and lower manufacturing cost than the conventional illumination apparatus 10.

For increasing structural strength and heat dissipation effect, the illumination apparatus 100a of the present embodiment can further include a cover 180 and a heat dissipation fin set 190. Specifically, the cover 180 includes a top portion 182 and a plurality of side portions 184 connecting to the top portion 182, and the top portion 182 is disposed on the flat portion 154 of the light transmission cap 150. The heat dissipation fin set 190 is disposed on a lower surface 114, opposing to the upper surface 112, of the thermal conductivity substrate 110, and the side portions 184 of the cover 180 are attached on the heat dissipation fin set 190. As shown in FIG. 2A, the cover 180 of the present embodiment is fixed on the heat dissipation fin set 190 using screws T, but the fixing method is not limited thereto. Herein, the material of the cover 180 can be metal or plastic.

In addition, in the illumination apparatus 100a of the present embodiment, the light emitting element 130 is electrically connected to and energized by an external circuit (not shown) such as the light emitting element 130 is electrically connected to the package carrier 120a by the bonding wire 140 and the package carrier 120a is electrically connected to the external circuit by an electric wire 210. Particularly, as shown in FIG. 2A, the electric wire 210 lies among the cover 180, the first seal ring 160, and the second seal ring 170 and passes through the cover 180 to electrically connected to the external circuit. Therefore, the electric wire 210 lies outside the waterproofing chamber S. As a result, the location of the electric wire 210 does not affect the sealing effect surrounding the light emitting element 130.

It should be noticed that the reference numerals and a part of the contents of the aforementioned embodiment are also used in the following embodiments, and like reference numerals in the following embodiments denote like elements, and thus descriptions of the same technical contents are omitted. Moreover, the aforementioned embodiment can be referred for the omitted part, so that detailed descriptions thereof are not repeated.

Figure 3:
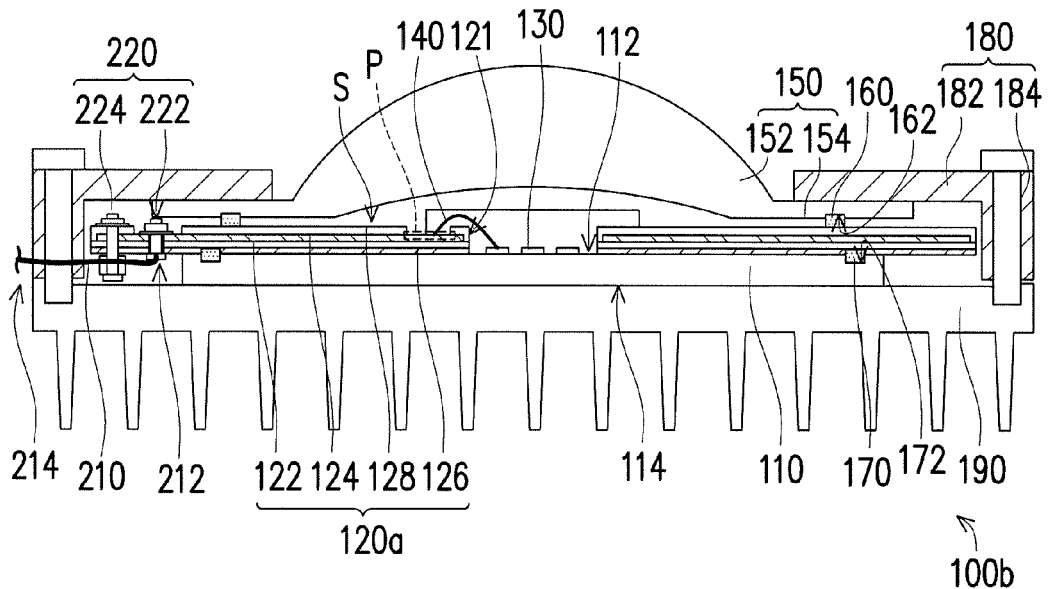
FIG. 3 is a schematic view of an illumination apparatus according to another embodiment of the invention.

FIG. 3 is a schematic view of an illumination apparatus according to another embodiment of the invention. Referring to the FIG. 3, the illumination apparatus 100b of the present embodiment is similar to the illumination apparatus 100a of FIG. 2A, and a difference there between is that the illumination apparatus 100b further includes a wire fixing structure 220. The electric wire 210 is electrically connected to the package carrier 120a. The wire fixing structure 220 is penetrating through the package carrier 120a and located between the first seal ring 160, the second seal ring 170 and the cover 180 such that the electric wire 210 is stored by the wire fixing structure 220.

More specifically, the wire fixing structure 220 includes a wire fixing terminal portion 222 and a wire storage portion 224 such that a terminal 212 of the electric wire 210 is plugged in the wire fixing terminal portion 222 and another terminal 214 of the electric wire 210 passes through the wire storage portion 224 and the cover 180. In the illumination apparatus 100b of the present embodiment, the electric wire 210 electrically connected to the package carrier 120a is organized and stored by the wire fixing structure 220 such that the configuration space in the illumination apparatus 100b can be saved.

Figure 4:
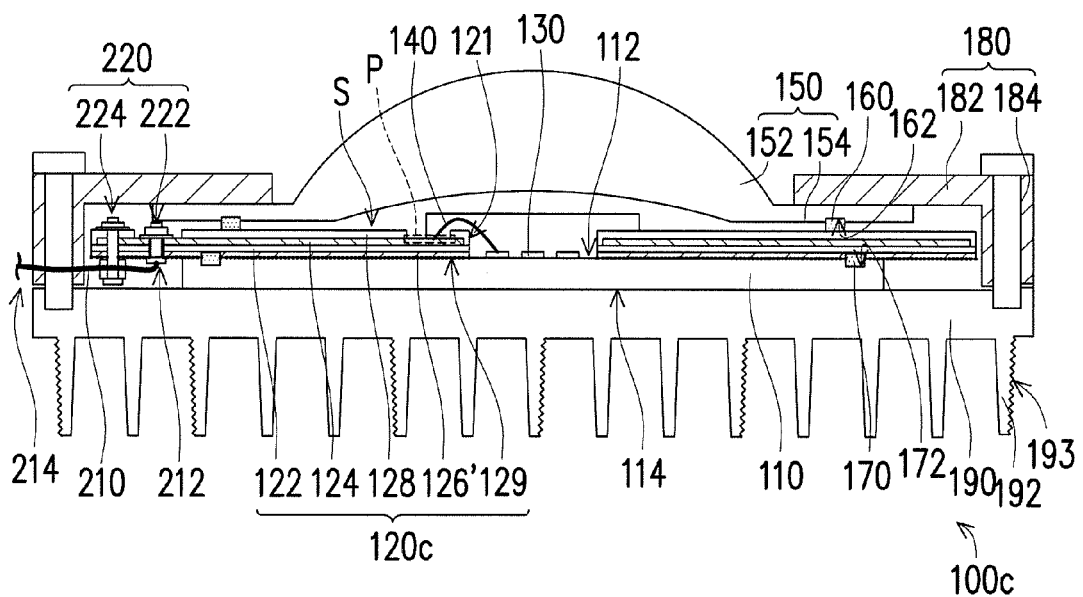
FIG. 4 is a schematic view of an illumination apparatus according to another embodiment of the invention.

FIG. 4 is a schematic view of an illumination apparatus according to another embodiment of the invention. Referring to the FIG. 4, the illumination apparatus 100c of the present embodiment is similar to the illumination apparatus 100b of FIG. 3, and a difference therebetween is the package carrier 120c of the illumination apparatus 100c, a rough surface structure 129 is disposed on the conductive layer 126' which is the closest to the thermal conductivity substrate 110 and in touch directly with the thermal conductivity substrate 110. By using the rough surface structure 129, the heat dissipation area is increased, thus the heat dissipation effect of the illumination apparatus 100c is also increased.

It should be noted that, because of increasing the joining force between the package carrier 120a, 120c and the thermal conductivity substrate 110, an adhesive layer (not shown) is disposed in between the package carrier 120a, 120c and the thermal conductivity substrate 110. Since the package carrier 120c has the rough surface structure 129, the adhesive layer is filled in the gaps between the package carrier 120c, the thermal conductivity substrate 110 and the rough surface structure 129. In addition, in order to increase the heat dissipation effect of the illumination apparatus 100a, 100b, and 100c, a rough surface 193 (as depicted in FIG. 4) is designed on a part or a whole of the heat dissipation fin 192 of the heat dissipation fin set 190, but not limited thereto.

In summary, the light emitting element of the illumination apparatus of the embodiment is disposed on a part of thermal conductivity substrate exposed by the opening of the package carrier and electrically connected to the package carrier by the bonding wire, and the thermal conductivity substrate, the light transmission cap, the first seal ring, the second seal ring, and the package carrier encapsulate the light emitting element. Therefore, in illumination apparatus of the embodiment, the complete sealing effect is achieved by organizing the thermal conductivity substrate, the light transmission cap, the first seal ring, the second sealing ring, and the package carrier instead of using a plurality of metal covers and waterproofing plug. As a result, the illumination apparatus of the embodiment has smaller volume, thinner thickness, lighter weight, and lower manufacturing cost than the conventional illumination apparatus.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:
1. An illumination apparatus, comprising:
   a thermal conductivity substrate having an upper surface;

a package carrier disposed on the upper surface of the thermal conductivity substrate and having an opening, the opening exposing a portion of the upper surface of the thermal conductivity substrate, wherein the package carrier comprises at least one insulating layer, a plurality of conductive layers, and a solder mask layer, the insulating layer and the conductive layers are alternatively stacked up, the solder mask layer exposes a part of one conductive layer to define at least one bonding pad;

at least one light emitting element disposed on the upper surface of the thermal conductivity substrate exposed by the opening of the package carrier;

at least one bonding wire electrically connecting the light emitting element to the package carrier, wherein a terminal of the bonding wire is disposed on the bonding pad;

a light transmission cap disposed above the thermal conductivity substrate, wherein the light emitting element and the package carrier are located between the light transmission cap and the thermal conductivity substrate;

a first seal ring disposed between the light transmission cap and the package carrier; and a second seal ring disposed between the package carrier and the thermal conductivity substrate, wherein the thermal conductivity substrate, the light transmission cap, the first seal ring, the second seal ring and the package carrier completely seal the light emitting element.

2. The illumination apparatus as recited in claim 1, wherein the thermal conductivity substrate comprises a heat spreader or a heat dissipation plate.

3. The illumination apparatus as recited in claim 1, wherein the first seal ring and the second seal ring are respectively O-shaped rings.

4. The illumination apparatus as recited in claim 1, wherein the light transmission cap comprises a light transmission cap portion and a flat portion connected to the light transmission cap portion, and the light transmission cap portion is disposed correspondingly to the light emitting element.

5. The illumination apparatus as recited in claim 4, further comprising:

a cover comprising a top portion and a plurality of side portions connected to the top portion, wherein the top portion is disposed on the flat portion of the light transmission cap;

a heat dissipation fin set disposed on a lower surface of the thermal conductivity substrate, the lower surface being opposite to the upper surface, and the side portions of the cover being fixed on the heat dissipation fin set; and an electric wire electrically connected to the package carrier and located among the first seal ring, the second seal ring and the cover.

6. The illumination apparatus as recited in claim 5, wherein a material of the cover comprises a metal or a plastic.

7. The illumination apparatus as recited in claim 5, comprising:

a wire fixing structure penetrating through the package carrier and located among the first seal ring, the second seal ring and the cover, wherein the electric wire is stored by the wire fixing structure.

8. The illumination apparatus as recited in claim 7, wherein the wire fixing structure comprises a wire fixing terminal portion and a wire storage portion, one terminal of the electric wire is plugged in the wire fixing terminal portion and another terminal of electric wire passes through the wire storage portion and the cover.

9. The illumination apparatus as recited in claim 1, wherein one of the conductive layers that is closest to the thermal conductivity substrate has a rough surface structure and the rough surface structure contacts with the thermal conductivity substrate.

10. An illumination apparatus, comprising:

a thermal conductivity substrate having an upper surface;

a package carrier disposed on the upper surface of the thermal conductivity substrate and having an opening, the opening exposing a portion of the upper surface of the thermal conductivity substrate, wherein the package carrier comprises at least one insulating layer, a plurality of conductive layers, and a solder mask layer, the insulating layer and the conductive layers are alternatively stacked up, the solder mask layer exposes a part of one conductive layer to define at least one bonding pad;

at least one light emitting element disposed on the upper surface of the thermal conductivity substrate exposed by the opening of the package carrier;

at least one bonding wire electrically connecting the light emitting element to the package carrier, wherein a terminal of the bonding wire is disposed on the bonding pad;

a light transmission cap disposed above the thermal conductivity substrate, wherein the light emitting element and the package carrier are located between the light transmission cap and the thermal conductivity substrate;

a first seal ring disposed between the light transmission cap and the package carrier;

a second seal ring disposed between the package carrier and the thermal conductivity substrate, wherein the thermal conductivity substrate, the light transmission cap, the first seal ring, the second seal ring and the package carrier completely seal the light emitting element; and a wire fixing structure penetrating through the package carrier and located among the first seal ring, the second seal ring and a cover, wherein an electric wire is stored by the wire fixing structure, wherein the wire fixing structure comprises a wire fixing terminal portion and a wire storage portion, one terminal of the electric wire is plugged in the wire fixing terminal portion and another terminal of electric wire passes through the wire storage portion and the cover.

11. An illumination apparatus, comprising:

a thermal conductivity substrate having an upper surface and a lower surface being opposite to the upper surface;

a package carrier disposed on the upper surface of the thermal conductivity substrate and having an opening, the opening exposing a portion of the upper surface of the thermal conductivity substrate, wherein the package carrier comprises at least one insulating layer, a plurality of conductive layers, and a solder mask layer, the insulating layer and the conductive layers are alternatively stacked up, the solder mask layer exposes a part of one conductive layer to define at least one bonding pad;

at least one light emitting element disposed on the upper surface of the thermal conductivity substrate exposed by the opening of the package carrier;

at least one bonding wire electrically connecting the light emitting element to the package carrier, wherein a terminal of the bonding wire is disposed on the bonding pad;

a light transmission cap disposed above the thermal conductivity substrate, wherein the light emitting element and the package carrier are located between the light transmission cap and the thermal conductivity substrate, wherein the light transmission cap comprises a light transmission cap portion and a flat portion connected to the light transmission cap portion, and the light transmission cap portion is disposed correspondingly to the light emitting element;

a first seal ring disposed between the light transmission cap and the package carrier;

a second seal ring disposed between the package carrier and the thermal conductivity substrate, wherein the thermal conductivity substrate, the light transmission cap, the first seal ring, the second seal ring and the package carrier completely seal the light emitting element;

a cover comprising a top portion and a plurality of side portions connected to the top portion, wherein the top portion is disposed on the flat portion of the light transmission cap; and a heat dissipation fin set disposed on the lower surface of the thermal conductivity substrate, and the side portions of the cover being fixed on the heat dissipation fin set.

* * * * *